(12) United States Patent
Burrows et al.

(10) Patent No.: US 6,849,668 B1
(45) Date of Patent: Feb. 1, 2005

(54) ORGANO-SILICON COMPOUNDS AND THEIR USE AS PHOTOINITIATORS

(75) Inventors: Roger Edward Burrows, Kent (GB); Shaun Lawrence Herlihy, Kent (GB); Derek Ronald Illsley, Kent (GB)

(73) Assignee: Sun Chemical Corporation, Fort Lee, NJ (US)

( * ) Notice: Subject to any disclaimer, the term of this patent is extended or adjusted under 35 U.S.C. 154(b) by 152 days.

(21) Appl. No.: 10/048,858

(22) PCT Filed: Aug. 4, 2000

(86) PCT No.: PCT/GB00/03020

§ 371 (c)(1),
(2), (4) Date: May 23, 2002

(87) PCT Pub. No.: WO01/10872

PCT Pub. Date: Feb. 15, 2001

(30) Foreign Application Priority Data

Aug. 4, 1999  (GB) ............................................. 9918419

(51) Int. Cl.$^7$ ................................ C08F 2/46; C08J 3/28
(52) U.S. Cl. .......................... 522/34; 522/36; 522/65; 522/66; 556/51; 556/52; 556/55; 556/81; 556/87; 556/105; 556/400; 556/431; 556/436; 556/437; 556/9; 556/12
(58) Field of Search .................................. 522/34, 36, 65; 522/66; 556/9, 52, 54, 51, 81, 87, 105, 400, 431, 436, 437

(56) References Cited

U.S. PATENT DOCUMENTS

| | | | |
|---|---|---|---|
| 3,905,816 A | | 9/1975 | Boardman et al. |
| 3,924,520 A | | 12/1975 | Boardman et al. |
| 4,536,265 A | | 8/1985 | Fabrizio et al. ........ 204/159.13 |
| 4,587,276 A | * | 5/1986 | Lien et al. .................... 522/34 |
| 4,748,087 A | | 5/1988 | Davidson et al. |
| 4,833,035 A | * | 5/1989 | Eidenschink et al. .... 428/411.1 |
| 4,922,004 A | | 5/1990 | Köhler et al. ............... 560/221 |
| 4,922,044 A | | 5/1990 | Yates et al. .................. 570/263 |
| 5,071,936 A | | 12/1991 | Himori ......................... 528/26 |
| 5,192,642 A | * | 3/1993 | Steiner et al. ........... 430/281.1 |
| 5,229,253 A | * | 7/1993 | Zertani et al. ........... 430/281.1 |
| 5,527,925 A | * | 6/1996 | Chabrecek et al. ......... 549/430 |
| 5,532,112 A | | 7/1996 | Köhler et al. ............ 430/281.1 |
| 5,776,658 A | * | 7/1998 | Niesert et al. ........... 430/281.1 |
| 6,048,667 A | * | 4/2000 | Eldin et al. .............. 430/281.1 |
| 6,139,770 A | * | 10/2000 | Katsumoto et al. .... 252/188.28 |

FOREIGN PATENT DOCUMENTS

| | | |
|---|---|---|
| AU | A6603994 | 2/1995 |
| EP | 0161463 A1 | 4/1985 |
| EP | 0228145 A1 | 1/1986 |
| EP | 0228145 | 7/1987 |
| EP | 0632329 A1 | 6/1994 |
| EP | 2280905 A | 2/1995 |
| EP | 0798599 | 10/1997 |
| JP | A89230603 | 9/1989 |
| JP | 4-107568 | 4/1992 |
| JP | 4-146938 | 5/1992 |
| JP | 6263811 A | 9/1994 |
| JP | 6263812 A | 9/1994 |
| JP | 6263813 A | 9/1994 |
| JP | 6263814 A | 9/1994 |
| JP | 7-150054 | 6/1995 |
| JP | WO9717378 | 5/1997 |
| WO | WO9620919 | 7/1996 |
| WO | WO9707161 | 2/1997 |

OTHER PUBLICATIONS

James Light, et al., "A Water Soluble Tin Hydride Reagent", Tetrahedron Lett., vol. 31, No. 21, 1990, pp. 2957–2958.

"Polymers Containing Side–Chain Benzophenone Chromophores: A New Class of Highly Efficient Polymerization Photoinitiators," by Carlo Carlini, et al., Polymer Magazine, May 1993, vol. 24.

"U.V. and E.B. Curing Formulation for Printing Inks, Coatings and Paints," edited by Dr. R. Holman, Bsc. PhD.

"Polymeric Photoinitiators Bearing Side–Chain Benzoin Methyl Ether and Tertiary Amine Moieties For Fast U.V. Curable Coatings," by C. Carlini, et al.

"Photoinitators With Functional Groups. Part I. Polymer Photoinitiators," by R. Klos, et al.

"The Printing Ink Manual," edited Dr. R. H. Leach, VNR International.

* cited by examiner

*Primary Examiner*—Susan Berman
(74) *Attorney, Agent, or Firm*—Sidney Persley

(57) ABSTRACT

A multi-functional photoinitiator of formula (I)

$$R^1{}_m\text{—}Q\text{—}(A^1\text{—}PI)_n \qquad (I)$$

wherein Q is a heteroatom selected from Si, Ti, Zr and Sn or any two independently selected such heteroatoms linked by a covalent bond or a by $C_{1-16}$ (preferably $C_{1-9}$) alkylene group, n is at least 2 and n+m=the functionality of Q, each $R^1$ is the same or different and is a non-photoinitiator group; each group PI is the same or different and is a photoinitiator group.

Each —$A^1$— is the same or different and is selected from linking groups of formula —$(A^2)_p$—Z— wherein p has an average of from 1 to 10, preferably from 3 to 5 and the groups —$A^2$— are either (a) each independently selected from $C_{2-4}$ alkyleneoxy groups; or (b) each independently selected from groups of formula —O—$(CH_2)_q$CO— wherein q is from 3 to 5, and Z is selected from —O—, —S— and —$NR^6$— where $R^6$ is $C_{1-6}$ alkyl.

8 Claims, No Drawings

ORGANO-SILICON COMPOUNDS AND THEIR USE AS PHOTOINITIATORS

The present invention relates to initiators for radiation curable compositions, especially for photocurable compositions, intermediates for their preparation, processes for preparing the initiators from the intermediates and surface coating compositions containing the initiators.

Photocurable compositions are cured by exposure to light, usually ultraviolet light, and include for example, lacquers which may be applied to wood, metal or similar substrates by suitable techniques such as roll coating or curtain coating. They may also be formulated as inks, for example to be applied by techniques such as letterpress, offset lithography, rotogravure printing, silk screen printing or flexographic printing. Printing, depending on the particular printing technique, is applicable to a wide range of substrates which include paper, board glass, plastics materials or metals.

There is an increasing appreciation of a need to minimise migration and/or extraction of residual photoinitiator components from the cured product. For example, inks used in printing on plastics food packaging should ideally meet the stringent standards for minimisation of extractables from the coated and/or printed plastics. Such contamination can cause problems of taint and odour of the foodstuff. Moreover, for other coating compositions, it is important to minimise migration of reactive materials which may cause other undesirable effects such as loss of adhesion to the substrate, yellowing, or other undesirable effects.

One approach to reduce the concentration of residual photoinitiator components in the cured product and hence migratables and/or extractables is to use photoinitiators which contain an ethylenically unsaturated moiety, for example, 4-(2-acryloyloxyethoxy)-phenyl-(2-hydroxy-2-propyl) ketone as described in U.S. Pat. No. 4,922,044. The ethylenically unsaturated group enables the photoinitiator to become incorporated into the polymeric structure, during the curing process.

An alternative approach is to use photoinitiators of increased molecular size to reduce the level of migratable and/or extractable residual photoinitiator components in a cured coating or ink composition. Such polymeric photoinitiators are disclosed in EP-A-0 161 463 and include a commercially available compound. Fratelli-Lamberti's KIP 150. Examples of polymeric benzophenones have also been described (C. Carlini et al., Polymer 24, 599 (1983)). It is possible to combine the advantages of greater molecular size and ethylenic unsaturation in the same compound by incorporating a photoinitiator moiety into an ethylenically unsaturated vehicle such as urethane acrylate, as disclosed in GB-A-2 280 905.

The present invention is aimed at providing multi-functional photoinitiators (i.e. photoinitiators which are multi-functional with respect to photoinitiator groups). It has already been proposed that some multi-functional photoinitiators are capable of reducing levels of migratable and/or extractable residual photoinitiator components, compared with monofunctional photoinitiators.

WO-A-96/20919 discloses inter alia, oligomeric multi-functional initiators in which the photoinitiator groups are bonded to a multi-functional core by means of reaction between isocyanate groups on the initiator moiety and hydroxyl or amine groups of the core. WO-A-97/07161 discloses radiation-crosslinkable compositions which include certain multi-functional radiation-activatable crosslinking agents. EP-A-0 632 329 discloses α-aminoacetophenone analogues of the materials disclosed in WO-A-96/20919, i.e. formed by the same isocyanate chemistry. Neither of WO-A-96/20919 or EP-A 0 632 329 actually discloses the advantage of minimising migratables and/or extractables which may be achieved by use of multi-functional photoinitiators (although it has been proposed for other multi-functional materials, as will be explained further below). Moreover, those formed by the isocyanate route have a low concentration of functional groups per molecule and so need to be used in higher amounts in the final coating composition, which mitigates against the aim of reducing extractables and/or migratables. They also have a tendency to unduly high viscosities.

Multi-functional initiators having Type II (hydrogen abstractive-type) initiator groups are disclosed in JP-A-62 3811, '12, '13 and '14. These multi-functional Type II materials have relatively poor through-cure properties or else need to be used with an amine synergist. Both of these factors are actually disadvantageous to reducing extractables and/or migratables.

In order to solve the aforementioned problems, in particular to reduce extractables and/or migratables, WO-A-97/17378 teaches a class of multi-functional initiators based on a multi-functional core material to which are bonded two or more (preferably Type I (cleavage type) initiator groups), reacted via certain defined synthetic routes. However, there remains a need for further improvement in such multi-functional materials to give better performance in terms of speed of curing of the surface coating composition which contains such materials, whilst not sacrificing thermal stability.

The present invention provides this improvement by providing substituted non-polymeric structures based on heteroatoms, to which two or more photoinitiator groups are bonded via certain defined long-chain linking groups.

EP-A-0 228 145 discloses certain polysiloxanes with pendant initiator groups but having a polymeric core, these materials have low functionality per unit molecular weight. The same applies to the polysiloxane based materials disclosed in U.S. Pat. No. 4,536,265. Moreover, in the latter materials, the UV absorption chromophore is of a type which is not so advantageous for optimum curing in pigmented systems.

The materials disclosed in U.S. Pat. No. 5,071,936 are also polysiloxane-based and therefore also suffer from the disadvantages mentioned above. In addition, these materials are dithiocarbamates which are not suitable for photocuring by the free radical mechanism.

U.S. Pat. No. 5,532,112 discloses monofunctional photoinitiators containing a silicon atom and a plurality of pendant $C_1$–$C_{12}$ alkoxy groups.

In the first aspect, the present invention provides a multi-functional photoinitiator of formula (I)

$$R^1_m\text{—}Q\text{—}(A^1\text{—}PI)_n \qquad (I)$$

wherein Q is a heteroatom selected from Si, Ti, Zr and Sn or any two independently selected such heteroatoms linked by a covalent bond or a by $C_{1-16}$ (preferably $C_{1-9}$) alkylene group;

n is at least 2, and n+m=the functionality of Q;

each $R^1$ is the same or different and is a non-photoinitiator group;

each group PI is the same or different and is a photoinitiator group; and each —$A^1$— is the same or different and is selected from linking groups of formula —$(A^2)_p$—Z— wherein p has an average of from 1 to 10, preferably from 3 to 5, the groups —A²— are either (a) each independently selected from $C_{2-4}$ alkyleneoxy groups; or (b) each independently selected from groups of formula —O—$(CH_2)_q$CO— wherein q is from 3 to 5, and Z is selected from —O—, —S— and —NR⁶— wherein R⁶ is $C_{1-6}$ alkyl.

In the multi-functional photoinitiators of formula (I), when Q comprises two heteroatoms, they are preferably the same. It is preferred that at least one of the heteroatoms, most preferably both are Si. On cost grounds, materials where Q represents only one heteroatom are preferred and most preferably, Q is preferably Si. Silicon and the other alternatives for Q all have a valency of 4. Tin can also have a valency of 2 but preferably, it is in the 4-valent state. When the valency of Q is 4, then if m and n are both 2, the initiator is difunctional. If m is 1 and n is 3, the initiator is trifunctional and if m is 0 and n is 4, the initiator is tetrafunctional.

For the avoidance of doubt, when Q comprises two heteroatoms, any or each R¹ group and each group —(A¹—PI) may independently be substituted on either heteroatom. However, the reaction chemistry by which these materials are prepared may result in a mixture of such molecules with different substitution patterns, albeit with the same average degree of substitution of each substituent.

When m is 1 or greater, each group R¹ is independently selected from non-photoinitiator groups. Clearly, an enormous range of such groups can readily be envisaged by persons skilled in the art, for example hydrogen or aliphatic or if cycloaliphatic groups having from 1 to 15 carbon atoms, aryl groups such as phenyl, optionally substituted by one or more groups such as $C_{1-4}$ alkyl, halo, $C_{1-4}$ alkoxy etc., and arylalkyl groups, e.g. having from 1 to 5 carbon atoms in the alkyl moiety thereof. The following are typical commercially available examples or examples which might become commercially available at a later date, but the invention is to be understood as in no way limited only to these. The typical example R¹ groups are hydrogen, $C_{1-6}$ alkyl, $C_{5-9}$ cycloalkyl, vinyl, glycidyl-$C_{1-4}$-alkyl, and acrylates generally, such as acrylate, methacrylate, hydroxyethyl acrylate and ethoxy/propoxy acrylate.

In formula (I), when —A²— represents $C_{2-4}$ alkyleneoxy then each —A²— group is preferably ethyleneoxy, propyleneoxy or the —A²— groups are selected from a mixture of ethyleneoxy and propyleneoxy groups. The case where all —A²— groups are ethyleneoxy is the most preferred.

In the formula (I), the photoinitiator groups PI are independently any Type I (cleavage type) and/or Type II (hydrogen abstractive type) initiator groups but for reducing extractables/migratables, those of Type I are preferred.

For avoidance of doubt, by "photoinitiator group", as used herein, is meant any pendant molecule which absorbs radiant energy and undergoes a chemical process which results in reactive intermediates capable of initiating the polymerisation process, by reference to the definition of photoinitiators in R. Holman, "UV and EB Curing Formulations for Printing Inks, Coatings and Paints", (1984), Sita Technologies, London). Accordingly, by "non-photoinitiator group", as used herein, is meant any pendant molecule that is not a photoinitiator group.

Suitable Type I photoinitiators include any of those described in U.S. Pat. No. 4,922,004, those described in JP-A-89-230 603, or the materials disclosed in Carlini el al (C. Carlini, L. Angiolini, N. Lelli, F. Ciardelli, P. A. Rollini; FATIPEC-Kongr, (1990), 20th, p.413) namely α-methylolbenzoin methyl ether acrylate.

Yet again, the vinyl-functional hydroxyalkylphenone Type I materials of Klos et al (R. Klos, H. Gruber, G. Greber; J. Macromol. Sci. Chem., A28, 925 (1991)may be used.

However, the most preferred PI groups of Type I are those of formula:

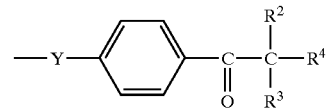

wherein Y represents a single bond or —$(CH_2)_r$—Z— (with Z directly linked to aromatic ring) where r=1 to 6, preferably 2 to 4, more preferably 2, and Z is as defined above; and R² and R³ are independently selected from $C_{1-12}$ alkyl groups or benzyl groups or together are joined to form a $C_5$–$C_{15}$ alkylene chain and R⁴ represents hydroxy, phenyl or tertiary amino group. Most preferred is when R² and R³ are $C_{1-4}$ alkyl (e.g. methyl) and R⁴ is hydroxy.

Type II initiator groups are preferably chosen from benzophenone and thioxanthone types.

Typical benzophenone Type II photoinitiator groups are

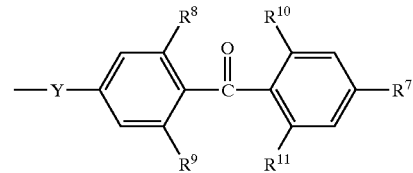

wherein R⁷ is selected from hydrogen, $C_{1-6}$ alkyl, $C_{1-6}$ alkoxy, phenyl, tertiary amine groups (preferably dimethyl amino, diethylamino or morpholino), or optionally substituted thiophenyl groups (preferably 4-methyl phenyl sulphide), each of R⁸–R¹¹ is independently selected hydrogen methyl and methoxy groups, and Y is as defined above. Most preferred is when case is when each of R⁸–R¹¹ is hydrogen.

Typical thioxanthone Type II photoinitiator groups are

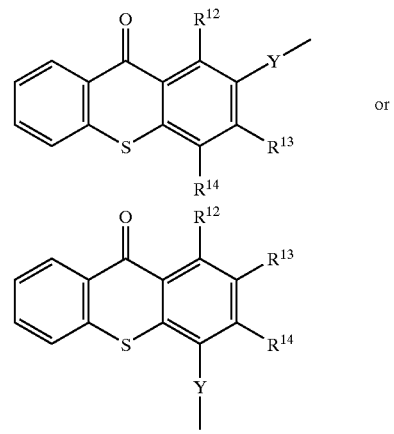

wherein R¹² is selected from hydrogen or chloro, R¹³ and R¹⁴ are independently selected from $C_{1-6}$ alkyl, $C_{1-6}$ alkoxy, phenyl and chloro groups, and Y is as defined above. Most preferred is when each of R¹²–R¹⁴ is hydrogen.

Initiators of formula (I) may be prepared by a process according to a second aspect of the present invention which comprises reacting a reactive compound of formula (II)

wherein R¹, Q, m and n are as hereinbefore defined and each group R⁵ is independently selected from halo (preferably chloro) and $C_{1-4}$ alkoxy groups with one or more compounds of formula (III)

wherein $A^1$ and PI are as hereinbefore defined.

The intermediates of formula (III) wherein $A^2$ represents $C_{2-4}$ alkyleneoxy may conveniently be prepared by reacting a compound of formula (IV)

wherein PI is as hereinbefore defined, with ethylene oxide, propyleneoxide or polytetrahydrofurans or a mixture of two or more thereof, as appropriate.

When $A^2$ represents —O—$(CH_2)_q$CO— then the intermediate of formula (III) may be prepared by reacting a compound of formula (IV) as hereinbefore defined with ε or γ valerolactone, γ or ε-caprolactone or β or γ-butyrolactone as appropriate.

The materials of formula (I) and formula (III) may be used in photocurable coating compositions, especially liquid coating compositions such as varnishes, flexographic inks, gravure inks, lithographic inks, inkjet inks, screen inks or specialist coatings for the manufacture of printed circuit boards. However, they may also find application in photocurable powder compositions which melt, flow and then are cured. Photocurable compositions comprising at least one material of formula (I) constitute another aspect of the present invention.

Typically, the coating compositions according to the invention contain one or more ethylenically unsaturated monomers and/or oligomers, and the photoinitiator.

The multi-functional initiators of formula (I) are especially suited for varnishes and inks for lithographic printing. These typically comprise, as additional components, one or more of pigments, waxes, stabilisers, flow aids, oligomers and monomers, for example as described in "Printing Ink Manual", fourth edition, Leach R. H. et al. (eds.), Van Nostrand Reindhold, Wokingham, (1988).

The present invention will be further illustrated by reference to the following non-limiting examples:

EXAMPLES

Example 1

200 g 4-(2-Hydroxyethoxy)phenyl-2(2-hydroxy-2-propyl) ketone [Irgacure 2959] (0.89M). 355.1 g ε-caprolactone (3.11M) and 0.3 g 2,6 di-t-butyl-4-methylphenol[BHT] were charged to a flask and heated at 110° C. with stirring for 24 hours. The reaction was catalysed with 8 drops of dibutyltindilaurate. The product form the reaction was collected and analysed by GPC, IR and NMR.

Example 2

100.0 g of the material of Example 1 (0.16M) and 16.6 g triethylamine (0.16M) were dissolved in 300 ml dry THF. 11.29 g Phenyltrichlorosilane (0.05M) in 30 ml THF was added to the other reactants dropwise, with stirring, at room temperature, under a nitrogen atmosphere over a period of two hours. The reaction mixture was then stirred for an additional 4 hours to ensure that the reaction had gone to completion. The reaction produced a white precipitate of triethylamine hydrochloride which was removed by filtration and the solvent removed by evaporation. The crude adduct was dissolved in 150 ml dichloromethane and washed with dilute hydrochloric acid (3×100 ml deionised water). The organic layer was then collected, dried and reduced leaving the product. This product was analysed by IR and NMR.

Example 3

50.0 g of the material of Example 1 (0.08M) and 16.6 g triethylamine (0.16M) were dissolved in 300 ml dry THF. 3.95 g Methyltrichlorosilane (0.026M) in 30 ml THF was added to the other reactants dropwise, with stirring at room temperature, under a nitrogen atmosphere over a period of one hour. The reaction mixture was then stirred for an additional 8 hours to ensure that the reaction had gone to completion. The reaction produced a white precipitate of triethylamine hydrochloride which was removed by filtration and the solvent removed by evaporation. The crude adduct was dissolved in 150 ml dichloromethane and washed with dilute hydrochloric acid (3×100 ml deionised water). The organic layer was then collected, dried and reduced leaving the products. This product was analysed by IR and NMR.

Example 4

53.6 g Ethoxylated 4-(2-hydroxyethoxy)phenyl-(2-hydroxy-2-propyl) ketone (0.141M) and 15.0 g triethylamine (0.15M) were dissolved in 300 ml dry THF. 10.0 g Phenyltrichlorosilane (0.05M) in 50 ml THF was added to the other reactants dropwise, with stirring, at room temperature, under a nitrogen atmosphere over a period of 30 minutes. The reaction mixture was stirred at room temperature for an additional 2.5 hours, before being warmed for further 1.5 hours at 60° C. to ensure that the reaction had gone to completion. The reaction produced a white precipitate of triethylamine hydrochloride which was removed by filtration and the solvent removed by evaporation. The crude adduct was dissolved in 200 ml chloroform and washed with 0.1M hydrochloric acid (3×75 ml) and distilled water (2×100 ml). The organic layer was then collected, dried and reduced leaving the product. This product was analysed by IR and NMR.

Examples 5 & 6

Varnish Formulations 0.5 g Initiator*

2.0 g CN104 D80 (epoxydiacrylate oligomer ex Cray Valley Ltd.)

0.2 g Benzophenone 0.8 g CN381 (aminoacrylate synergist ex Cray Valley Ltd.)

6.5 g GPTA**

*Example 5 was prepared using the initiator of Example 2 and Example 6, using the initiator of Example 3.

**glycerol propoxy triacrylate

The formulations were prepared as 10.0 g samples and cured on Leneta charts. The coatings were applied using a white Kbar (no. 0) giving a film thickness of 3 μm. These coatings were cured by passing them through a UV curing rig which incorporates a medium pressure mercury arc lamp that generates an output of 80W/cm². Various belt speeds were used to determine the rate of through and surface cure of the varnishes. The solvent resistance of the coatings was also determined using the methyl ethyl ketone (MEK) rub test.

Example 7 & 8

Flexographic Ink Formulations

The flexographic inks were produced using an ink concentrate formulation that is letdown in to an ink with the addition of other additives.

0.5 g Initiator⁺

4.0 g Black pigment concentrate 3.0 g CN104 D80 (epoxydiacrylate oligomer ex Cray Valley Ltd.)

0.4 g Quantacure EHA (aminobenzoate ex Great Lakes Chemical Corp.)

0.1 g Isopropyl thioxanthone 2.0 g GPTA

⁺Example 7 was prepared using the initiator of Examples 2 and 8, using the material of Example 3.

The inks were applied to a polyethylene film using a handhold anilox roller. The through and surface cure of the inks was determined again by curing at various belt speeds under a UV curing rig.

In comparison to an analogous compound it was shown that the formulations of Examples 7 and 8 cured at a faster rate than a control using a standard flexographic ink containing an equivalent amount of a photoinitiator system comprising benzophenone isopropyl thioxanthone and the aminobenzoate synergist Quantacure EHA. Also, these formulations of Examples 7 and 8 were shown to cure faster than conventional multi-functional photoinitiator systems in these flexographic formulations.

Lithographic Ink Formulations

Examples 9 & 10

0.55 g Initiator⁺⁺

0.2 g GPTA 1.05 g CN 113 D70 (epoxy novolac acrylate oligomer ex Cray Valley Ltd.)

1.6 g DiTMPTA*⁺

6.15 Black Pigment concentrate 0.21 g Isopropyl thioxathone 0.24 g Quantacure EHA ⁺⁺Example 9 was prepared using the initiator of Example 3 and Example 10 was prepared using the initiator of Example 4.

*⁺ditrimethylolpropane tetraacrylate

The initiators were formulated into offset inks and compared with that of a standard UV curing process ink, namely Unicure UB1203 process black (ex Coates Lorilleux). The inks were cured using one lamp at full power on a Wallace Knight rig that generates an output of 300W/cm². The results showed that the ink of Example 10 cured with a similar, if not with a faster rate than that of the aforementioned commercially available ink, despite having a significantly lower concentration of functional initiator groups (i.e. on an equal-molar basis, the ink of Example 9 would cure significantly faster). The inks of Example 9 and 10 were also shown to have a comparable lithographic performance and better odour characteristics.

Example 11

149.0 g of 4-hydroxybenzophenone (0.75M) and 60.0 g of sodium hydroxide (1.5M) were added to 1500 ml of deionised water and heated to 100° C. with stirring. The reaction was held at 100° C. for 30 minutes before cooling to 60° C. 121.2 g of 2-chloroethanol (1.5M) were added and the reaction held at 55° C. for 2 hours. A precipitate was produced by the reaction which was dissolved in dichloromethane and separated from the aqueous layer, dried and the solvent removed by evaporation leaving the product.

Example 12

121.0 g of the material of Example 11 (0.5M), 57.0 g of ε-caprolactone (0.5M) and 0.1 g of 2,6-di-t-butyl-4-methylphenol [BHT] were charged to a flask containing 600 ml of toluene and heated with stirring. At 60° C. the reaction was a clear solution and 60 drops of dibutyltindilaurate were added to catalyse the reaction. The reaction was heated to 110° C. and held for 4.5 hours. The product was collected and analysed by HPLC.

Example 13

106.8 g of material from Example 12 (0.3M) and 31.3 g of triethylamine (0.31M) were dissolved in 500 ml of toluene and cooled to below 5° C. 15.0 g of methyltrichlorosilane (0.1M) were dissolved in 200ml of toluene and added to the reaction dropwise with stirring over 2 hours. The reaction produced a white precipitate of triethylamine hydrochloride, which was removed by filtration. The solvent was removed by evaporation to leave the product.

Example 14

112.0 g of 4-(2-hydroxyethoxy)phenyl-2(2-hydroxy-2-propyl)ketone [Irgacure 2959] (0.5M), 57.0 g of ε-caprolactone (0.5M) and 0.1 g of 2,6-di-t-butyl-4-methylphenol [BHT] were charged to a flask containing 500 ml of toluene and heated with stirring at 110° C. for 4 hours. The reaction was catalysed with 60 drops of dibutyltindilaurate. The product was collected by evaporation and analysed by HPLC.

Example 15

101.4 g of material from Example 14 (0.3M) and 31.3 g of triethylamine (0.31M) were dissolved in 400 ml of toluene and cooled to below 5° C. 15.0 g of methyltrichlorosilane (0.1M) were dissolved in 200 ml of toluene and added to the reaction dropwise with stirring over 2 hours. The reaction produced a white precipitate of triethylamine hydrochloride, which was removed by filtration. The solvent was removed by evaporation to leave the product.

Example 16

75.6 g of ethoxylated 4-(2-hydroxyethoxy)phenyl-2(2-hydroxy-2-propyl)ketone (0.2M) and 20.2 g of triethylamine (0.2M) were dissolved in 300 ml of dichloromethane with stirring and cooled to below 5° C. 12.8 g of bis (methyldichlorosilyl)ethane (0.05M). dissolved in 50 ml of dichloromethane, were added dropwise over 2 hours with cooling and stirring. The reaction produced a white precipitate of triethylamine hydrochloride, which was removed by filtration. The solvent phase was washed with dilute hydrochloric acid and deionised water before drying. The solvent was removed by evaporation to leave the product.

Example 17

100.5 g of ethoxylated 4-(2-hydroxyethoxy)phenyl-2(2-hydroxy-2-propyl)ketone (0.266M) and 26.9 g of triethylamine (0.266M) were dissolved in 300 ml of dichloromethane with stirring and cooled to below 5° C. 11.4 g of silicon tetrachloride (0.066M), dissolved in 50 ml of dichloromethane, were added dropwise over 2 hours with cooling and stirring, the reaction was then allowed to rise to room temperature over 3 hours. The reaction produced a white precipitate of triethylamine hydrochloride, which was removed by filtration. The solvent phase was washed with dilute hydrochloric acid and deionised water before drying. The solvent was removed by evaporation to leave the product.

Example 18

56.7 g of ethoxylated 4-(2-hydroxyethoxy)phenyl-2(2-hydroxy-2-propyl)ketone (0.15M) and 15.2 g of triethylamine (0.15M) were dissolved in 250 ml of dichloromethane and cooled with stirring to below 5° C. 9.5 g of bis(trichlorosilyl)octane (0.025M), dissolved in 100 ml of dichloromethane, were added dropwise over 40 minutes with stirring. The reaction was maintained at below 5° C. for a further 2 hours followed by 24 hours at room temperature. The reaction produced a white precipitate of triethylamine hydrochloride, which was removed by filtration. The solvent phase was washed with dilute hydrochloric acid and deionised water before drying. The solvent was removed by evaporation to leave the product.

Example 19

113.4 g of ethoxylated 4-(2-hydroxyethoxy)phenyl-2(2-hydroxy-2-propyl)ketone (0.3M) and 31.3 g of triethylamine (0.31M) were dissolved in 800 ml of tetrahydrofuran [THF] and cooled with stirring to below 5° C. 17.8 g of propyltrichlorosilane (0.1M), dissolved in 50 ml of THF, were added dropwise over 2 hours with stirring. The reaction was maintained at below 5° C. for a further 2 hours followed by 24 hours at room temperature. The reaction produced a white precipitate of triethylamine hydrochloride, which was removed by filtration. The solvent phase was washed with dilute hydrochloric acid and deionised water before drying. The solvent was removed by evaporation to leave the product.

Example 20

75.6 g of ethoxylated 4-(2-hydroxyethoxy)phenyl-2(2-hydroxy-2-propyl)ketone (0.2M) and 20.2 g of triethylamine (0.2M) were dissolved in 300 ml of toluene with stirring and cooled to below 5° C. 13.025 g of Tin IV chloride (0.05M), dissolved in 50 ml of toluene, were added dropwise with cooling and stirring. The reaction produced a white precipitate, which was removed by filtration. The solvent was removed by evaporation to leave the product.

What is claimed is:

1. A multi-functional photoinitiator of formula (I)

  (I)

wherein Q is a heteroatom selected from Si, Ti, Zr and Sn or any two independently selected such heteroatoms linked by a covalent bond or by a $C_{1-16}$ (preferably $C_{1-9}$) alkylene group;

n is at least 2 and n+m=the functionality of Q;

each $R^1$ is the same or different and is a non-photoinitiator group;

each group PI is the same or different and is a photoinitiator group; and each —$A^1$— is the same or different and is selected from linking groups of formula —$(A^2)_p$—Z— wherein p has an average of from 1 to 10, preferably from 3 to 5 and the groups —$A^2$— are either (a) each independently selected from $C_{2-4}$ alkyleneoxy groups; or (b) each independently selected from groups of formula —O—$(CH_2)_q$CO— wherein q is from 3 to 5, and Z is selected from —O—, —S— and —$NR^6$— where $R^6$ is $C_{1-4}$ alkyl.

2. A photoinitiator according to claim 1, wherein the $R^1$ groups are independently selected from hydrogen, aliphatic and cycloaliphatic groups having from 1 to 15 carbon atoms, aryl groups such as phenyl, optionally substituted by one or more groups such as $C_{1-4}$ alkyl, halo and $C_{1-4}$ alkoxy, and arylalkyl groups preferably having from 1 to 5 carbon atoms in the alkyl moiety thereof.

3. A photoinitiator according to claim 1, wherein the $R^1$ groups are independently selected from hydrogen, $C_{1-4}$ alkyl, $C_{5-9}$ cycloalkyl, vinyl, glycidyl-$C_{1-4}$-alkyl, and acrylate groups such as acrylate, methacrylate, hydroxyethylacrylate and ethoxy- or propoxy-acrylate.

4. A photoinitiator according to claim 1, wherein when —$A^2$— represents $C_{2-4}$ alkyleneoxy, each —$A^2$— is ethyleneoxy, propyleneoxy or the —$A^2$-groups are selected from a mixture of ethyleneoxy and propyleneoxy groups.

5. A photoinitiator according to claim 1, wherein the or each PI group is a Type I (cleavage type) photoinitiator group.

6. A photoinitiator according to claim 1 wherein the PI groups are independently selected from those of formula

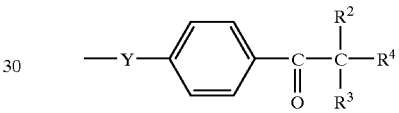

wherein Y represents a single bond or —$(CH_2)_r$—Z— (with Z directly linked to aromatic ring) where r=1 to 6, preferably 2 to 4, more preferably 2, and Z is as defined for formula (I); and $R^2$ and $R^3$ are independently selected from $C_{1-12}$ alkyl groups or benzyl groups or together are joined to form a $C_5$-$C_{15}$ alkylene chain and $R^4$ represents hydroxy, phenyl or a primary, secondary or tertiary amino group.

7. A composition, curable by exposure to UV radiation, containing:

(a) a polymerisable component comprising one or more ethylenically unsaturated monomers and/or oligomers; and (b) a photoinitiator component as claimed in claim 1.

8. A process for the preparation of a multi-functional photoinitiator according to claim 1, which process reacting a reactive compound of formula (II)

  (II)

wherein $R^1$, Q, m and n are as hereinbefore defined and each group $R^5$ is independently selected from halo (preferably chloro) and $C_{1-4}$ alkoxy groups with one or more compounds of formula (III)

  (III)

wherein $A^1$ and PI are as hereinbefore defined.

* * * * *